(12) United States Patent
Sawada

(10) Patent No.: US 10,892,018 B2
(45) Date of Patent: Jan. 12, 2021

(54) SEMICONDUCTOR MEMORY DEVICE AND REFRESHING METHOD OF SEMICONDUCTOR MEMORY DEVICE

(71) Applicant: RENESAS ELECTRONICS CORPORATION, Tokyo (JP)

(72) Inventor: Seiji Sawada, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 163 days.

(21) Appl. No.: 16/152,148

(22) Filed: Oct. 4, 2018

(65) Prior Publication Data

US 2019/0172541 A1 Jun. 6, 2019

(30) Foreign Application Priority Data

Dec. 5, 2017 (JP) ................. 2017-233135

(51) Int. Cl.
| | |
|---|---|
| G11C 16/16 | (2006.01) |
| G11C 16/10 | (2006.01) |
| G11C 16/26 | (2006.01) |
| G06F 12/06 | (2006.01) |
| G11C 16/08 | (2006.01) |

(52) U.S. Cl.
CPC .......... *G11C 16/16* (2013.01); *G06F 12/0646* (2013.01); *G11C 16/08* (2013.01); *G11C 16/10* (2013.01); *G11C 16/105* (2013.01); *G11C 16/26* (2013.01); *G06F 2212/1041* (2013.01)

(58) Field of Classification Search
CPC ......... G11C 16/16; G11C 16/08; G11C 16/10; G11C 12/0646; G11C 12/06
See application file for complete search history.

(56) References Cited

U.S. PATENT DOCUMENTS

| | | | |
|---|---|---|---|
| 5,699,297 | A | 12/1997 | Yamazaki et al. |
| 6,049,497 | A | 4/2000 | Yero |
| 2004/0257888 | A1 | 12/2004 | Noguchi et al. |

(Continued)

FOREIGN PATENT DOCUMENTS

JP 09-50698 A 2/1997

OTHER PUBLICATIONS

Extended European Search Report issued in corresponding European Patent Application No. 18196337.2-1203, dated Mar. 28, 2019.

*Primary Examiner* — Jay W. Radke
(74) *Attorney, Agent, or Firm* — McDermott Will & Emery LLP

(57) ABSTRACT

A semiconductor memory device includes a memory array including a plurality of memory blocks, an address allocation information storage unit which stores address allocation information, a block selection circuit which selects one memory block which corresponds to an input address which is input on the basis of the address allocation information and a refresh control circuit which controls a refreshing operation. One of the memory blocks is allotted to a surplus memory block. The refresh control circuit transfers data which is stored in one memory block which is a refreshing object to the surplus memory block and thereafter allocates address information of the memory block which was the refreshing object to the surplus memory block to which the data is transferred and newly allots the memory block which was the refreshing object to the surplus memory block.

9 Claims, 9 Drawing Sheets

(56) References Cited

U.S. PATENT DOCUMENTS

| | | | |
|---|---|---|---|
| 2012/0278533 A1 | 11/2012 | Suzuki et al. | |
| 2013/0238931 A1* | 9/2013 | Suzuki | G06F 21/602 |
| | | | 714/15 |
| 2019/0004964 A1* | 1/2019 | Kanno | G06F 11/1048 |
| 2019/0155726 A1* | 5/2019 | Bhatia | G06F 12/0804 |

* cited by examiner

|  | MEMORY BLOCK | | | | |
|---|---|---|---|---|---|
|  | BLK_0 | BLK_1 | BLK_2 | BLK_3 | BLK_4 |
| ADDRESS ALLOCATION INFORMATION — BLK0F | H | L | L | L | L |
| BLK1F | L | H | L | L | L |
| BLK2F | L | L | H | L | L |
| BLK3F | L | L | L | H | L |

*FIG. 10*

| | | MEMORY BLOCK | | | | |
|---|---|---|---|---|---|---|
| | | BLK_0 | BLK_1 | BLK_2 | BLK_3 | BLK_4 |
| ADDRESS ALLOCATION INFORMATION | BLK0F | L | L | L | L | H |
| | BLK1F | L | H | L | L | L |
| | BLK2F | L | L | H | L | L |
| | BLK3F | L | L | L | H | L |

SEMICONDUCTOR MEMORY DEVICE AND REFRESHING METHOD OF SEMICONDUCTOR MEMORY DEVICE

CROSS-REFERENCE TO RELATED APPLICATIONS

The disclosure of Japanese Patent Application No. 2017-233135 filed on Dec. 5, 2017 including the specification, drawings and abstract is incorporated herein by reference in its entirety.

BACKGROUND

The present invention relates to a semiconductor memory device and a refreshing method of the semiconductor memory device and relates to, for example, the semiconductor memory device which is able to perform a refreshing operation and the refreshing method of the semiconductor memory device.

A nonvolatile semiconductor memory device has such an advantage that data is not erased even when power supply is stopped. However, it is indispensable to be able to retain the data for a time up to the product life. Data retention property is one of performances which are important for the nonvolatile semiconductor memory device and there is the refreshing operation as one of techniques for fulfilling the data retention property.

A technology relating to the refreshing operation of a flash memory is disclosed in Japanese Unexamined Patent Application Publication No. Hei 9(1997)-50698. In the technology disclosed in Japanese Unexamined Patent Application Publication No. Hei 9(1997)-50698, the refreshing operation is performed by performing data-transfer to a RAM (Random Access Memory) on data which is retained in a predetermined area of the flash memory so as to temporally save the data, thereafter erasing the data in this predetermined area and then transferring the saved data to the predetermined area of the flash memory and writing again the data into the predetermined area.

SUMMARY

As described above, in the technology disclosed in Japanese Unexamined Patent Application Publication No. Hei 9(1997)-50698, the data which is retained in the predetermined area of the flash memory is temporarily saved in the RAM which is provided outside the flash memory at the time of the refreshing operation. However, in a case where the data is to be temporarily saved in the RAM which is provided outside the flash memory, it is necessary to transfer the data to the outside of the flash memory and therefore there is such an issue that the refreshing operation is complicated.

Other subjects and novel features will become apparent from description of the present specification and the appended drawings.

According to one embodiment, one of a plurality of memory blocks is allotted to a surplus memory block and data which is stored in one memory block which is a refreshing object is transferred to the surplus memory block at the time of the refreshing operation. Then, after completion of data transfer to the surplus memory block, address information of the memory block which was the refreshing object is allocated to the surplus memory to which the data is transferred. In addition, the memory block which was the refreshing object is newly allotted to the surplus memory block.

According to the above-described one embodiment, it is possible to provide a semiconductor memory device which makes it possible to simplify the refreshing operation and a refreshing method of the semiconductor memory device.

BRIEF DESCRIPTION OF THE DRAWINGS

FIG. 10 is a table illustrating another example of the address allocation information which is stored in the address allocation information storage unit.

DETAILED DESCRIPTION

<Related Art>

Figure 1:
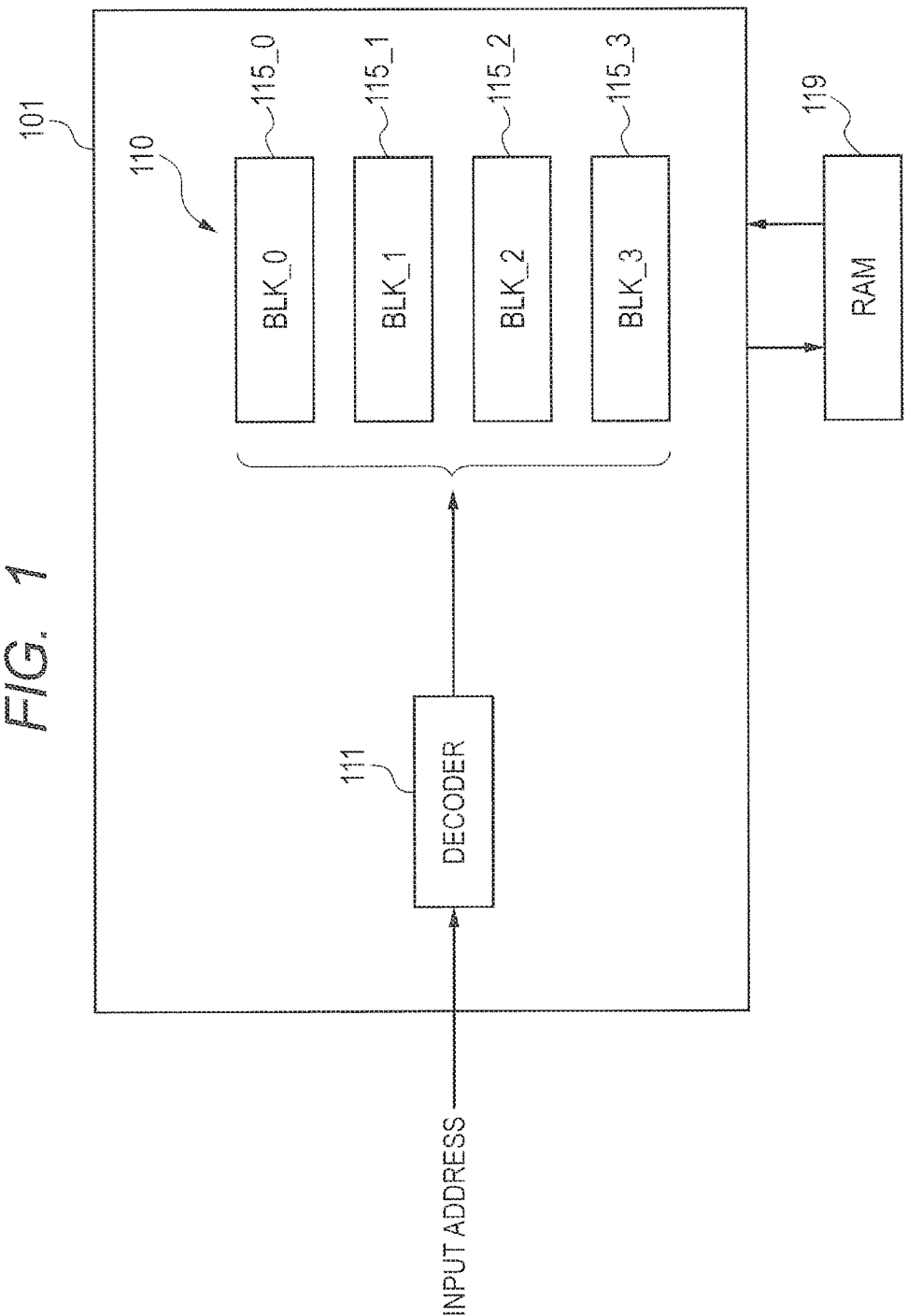
FIG. 1 is a block diagram illustrating one example of a semiconductor memory device pertaining to related art.

First, related art will be described. FIG. 1 is a block diagram illustrating one example of a semiconductor memory device pertaining to related art. As illustrated in FIG. 1, a semiconductor memory device (a flash memory) 101 pertaining to related art includes a memory array 110 and a decoder 111. A RAM (Random Access Memory) 119 is provided outside the semiconductor memory device 101.

The memory array 110 includes a plurality of memory blocks 115_0 to 115_3. The decoder 111 decodes an input address (an external address) which is input into the semiconductor memory device 101 and selects one memory block which corresponds to the input address from within the plurality of memory blocks 115_0 to 115_3.

Each of the plurality of memory blocks 115_0 to 115_3 that the memory array 110 includes corresponds to an erase unit of the flash memory. For example, when data is to be written into the memory block 115_0, first, all memory cells of the memory block 115_0 which is the erase unit are set to "1 s". Thereafter, writing is performed on one memory cell into which it is wished to write "0" in the memory cells of the memory block 115_0. Write processing is performed also on other memory blocks 115_1 to 115_3 similarly.

Incidentally, the semiconductor memory device (the flash memory) 101 which is illustrated in FIG. 1 and pertains to related art has such an advantage that the data is not erased even when power supply is stopped, and it is indispensable to retain the data for a time up to the product life. Data retention property is one of performances which are important for the semiconductor memory device 101 in this way. There is a refreshing operation as one of techniques for improving such data retention property.

For example, in a case where the refreshing operation is to be performed on the memory block 115_0 of the semiconductor memory device 101 illustrated in FIG. 1, first, data which is stored in the memory block 115_0 is transferred to and saved in the RAM 119 which is provided outside the semiconductor memory device 101. Then, block-erasing is performed on the memory block 115_0 and thereafter the data which is saved in the RAM 119 is transferred to and again written into the memory block 115_0.

The semiconductor memory device 101 pertaining to related art temporarily saves the data which is retained in the memory blocks 115_0 to 115_3 of the semiconductor memory device 101 in the RAM 119 which is provided outside the semiconductor memory device 101 at the time of the refreshing operation in this way. However, in a case where the data is to be temporarily saved in the RAM 119 which is provided outside the semiconductor memory device 101, it is necessary to transfer the data to the outside of the semiconductor memory device 101 and there is such an issue that the refreshing operation is complicated.

In an embodiment which will be described in the following, a semiconductor memory device which is able to solve such an issue and a refreshing method of the semiconductor memory device will be described.

<Embodiment>

Figure 2:
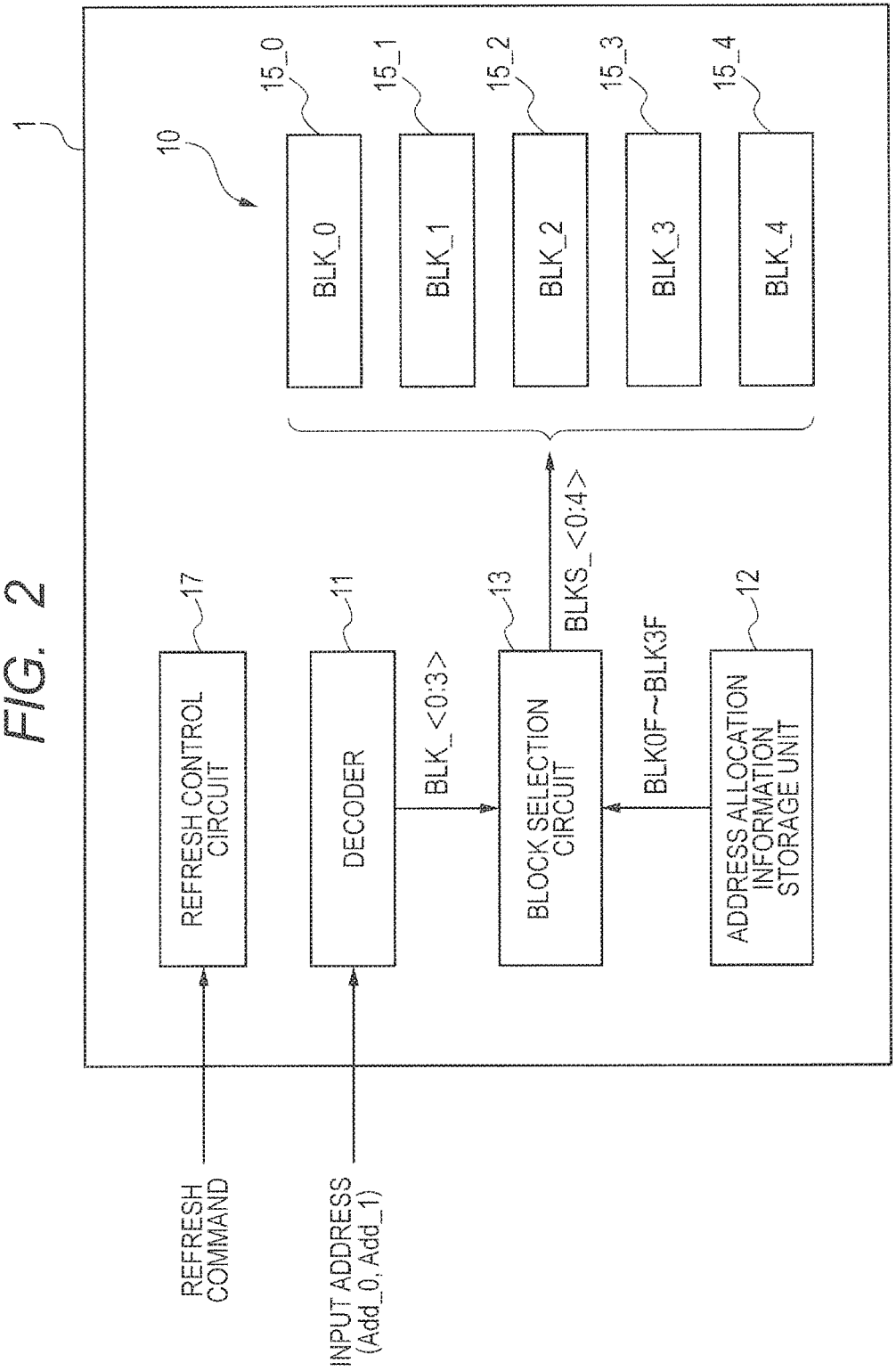
FIG. 2 is a block diagram illustrating one example of a semiconductor memory device according to an embodiment.

Next, a semiconductor memory device according to the embodiment will be described. FIG. 2 is a block diagram illustrating one example of the semiconductor memory device according to the embodiment. As illustrated in FIG. 2, the semiconductor memory device 1 according to the present embodiment includes a memory array 10, a decoder 11, an address allocation information storage unit 12, a block selection circuit 13 and a refresh control circuit 17.

The memory array 10 includes a plurality of memory blocks BLK_0 to BLK_4 (15_0 to 15_4). Each of the plurality of memory blocks BKL_0 to BLK_4 corresponds to a refresh unit of a flash memory. In addition, that unit has a size which is more (n times) than the size of the erase unit. Incidentally, although a configuration including the five memory blocks BLK_0 to BLK_4 is illustrated in FIG. 2, it is possible to optionally determine the number of the memory blocks that the memory array 10 includes.

For example, when data is to be written into the memory block BLK_0, first, all memory cells in the memory block BLK_0 which is the erase unit are set to "1 s". Thereafter, writing is performed on one memory cell into which it is wished to write "0" in the memory cells of the memory block BLK_0. Write processing is performed also on other memory blocks BLK_1 to BLK_4 similarly.

In addition, in the semiconductor memory device 1 according to the present embodiment, one of the plurality of memory blocks BLK_0 to BLK_4 is allotted as a surplus memory block into which no data is stored at an ordinary time. For example, in a case where the memory block BLK_4 is allotted as the surplus memory block, at the ordinary time, although data is stored into the memory blocks BLK_0 to BLK_3, no data is stored into the memory block BLK_4.

As will be described later, in the semiconductor memory device 1 according to the present embodiment, the data is written into the surplus memory block at the time of the refreshing operation and the surplus memory block is changed every time the refreshing operation is performed. In the present embodiment, "the ordinary time" indicates a case where the semiconductor memory device 1 is used as the flash memory and indicates a time other than "the time of the refreshing operation".

The decoder 11 decodes input addresses (Add_0, Add_1) which are input into the semiconductor memory device 1 and outputs an access address signal BLK_<0:3> used to access the memory block which corresponds to the input addresses (Add_0, Add_1) to the block selection circuit 13. Here, the input addresses (Add_0, Add_1) are addresses used to select the memory block. An address used for memory cell selection which will be described later is separately input.

Incidentally, in the present embodiment, a case where the input addresses are 2-bit address information is illustrated by way of example. That is, since each of the input addresses Add_0 and Add_1 is able to take a value of "L (a low level)" or "H (a high level)", it is possible to express four values by using the input address Add_0 and the input address Add_1 (that is, the two input addresses).

Figure 3:
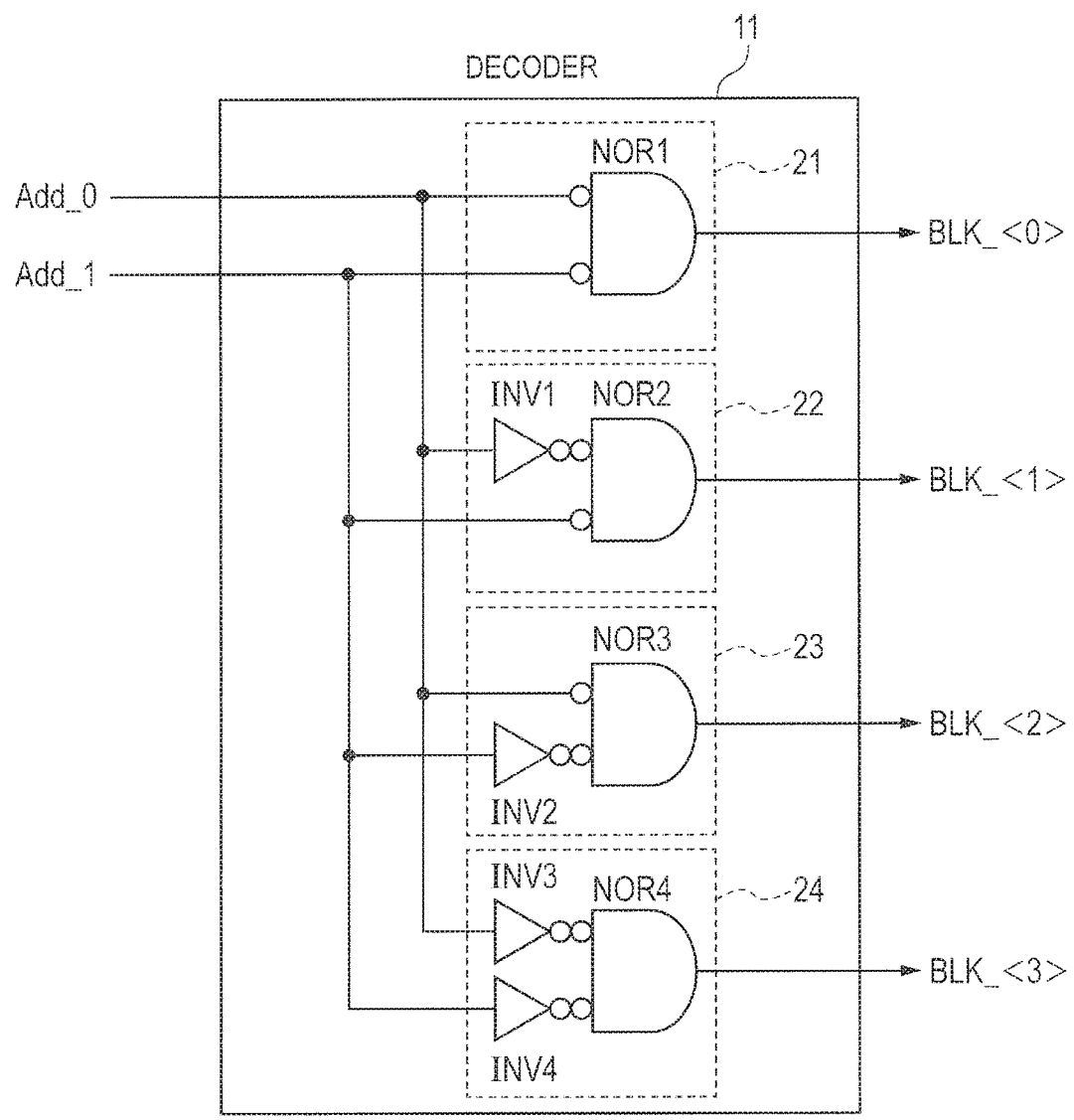
FIG. 3 is a circuit diagram illustrating a configuration example of a decoder that the semiconductor memory device according to the embodiment includes.

FIG. 3 is a circuit diagram illustrating one configuration example of the decoder 11 that the semiconductor memory device 1 according to the present embodiment includes. As illustrated in FIG. 3, the decoder 11 is configured by using a plurality of logic circuits 21 to 24. The input address Add_0 is supplied to one input terminals of the respective logic circuits 21 to 24 and the input address Add_1 is supplied to the other input terminals thereof. The respective logic circuits 21 to 24 are configured by combining NOR logics NOR1 to NOR4 with inverters INV1 to INV4 respectively. Specifically, the logic circuit 21 is configured by using the NOR logic NOR1. The logic circuit 22 is configured by using the NOR logic NOR2 and the inverter INV1 which is coupled to one input terminal of the NOR logic NOR2. The logic circuit 23 is configured by using the NOR logic NOR3 and the inverter INV2 which is coupled to the other input terminal of the NOR logic NOR3. The logic circuit 24 is configured by using the NOR logic NOR4 and the inverters INV3 and INV4 which are coupled to both input terminals of the NOR logic NOR4.

In a case where the input address Add_0 and the address Add_1 are both at the low levels, the logic circuit 21 outputs a high-level signal as an access address signal BLK_<0> and the logic circuits 22 to 24 output low-level signals as access address signals BLK_<1> to BLK_<3>. In this case, the decoder 11 outputs BLK_<0:3>=(H, L, L, L) to the block selection circuit 13 as the access address signal BLK_<0:3>. Incidentally, the notation of the access address signal BLK_<0:3> indicates four access address signals BLK_<0>, BLK_<1>, BLK_<2> and BLK_<3> and is also described as the access address signals BLK_<0> to BLK_<3> in some cases in the present specification. In addition, the notation of "BLK_<0:3>=(H, L, L, L) indicates that BLK_<0> outputs an "H" signal, BLK_<1> outputs an "L" signal, BLK_<2> outputs the "L" signal and BLK_<3> outputs the "L" signal respectively. The same applies hereafter.

In addition, it is supposed that in a case where the input address Add_0 is at the high level and the input address Add_1 is at the low level, the logic circuit 22 outputs the high-level signal as the access address signal BLK_<1> and the logic circuits 21, 23 and 24 output the low-level signals as the access address signals BLK_<0>, BLK_<2> and BLK_<3>. In this case, the decoder 11 outputs the access address signal BLK_<0:3>=(L, H, L, L) to the block selection circuit 13.

In addition, it is supposed that in a case where the input address Add_0 is at the low level and the input address Add_1 is at the high level, the logic circuit 23 outputs the high-level signal as the access address signal BLK_<2> and the logic circuits 21, 22 and 24 output the low-level signals as the access address signals BLK_<0>, BLK_<1> and BLK_<3>. In this case, the decoder 11 outputs the access address signal BLK_<0:3>=(L, L, H, L) to the block selection circuit 13.

In addition, it is supposed that in a case where the input address Add_0 and the input address Add_1 are both at the high levels, the logic circuit 24 outputs the high-level signal as the access address signal BLK_<3> and the logic circuits 21 to 23 output the low-level signals as the access address signals BLK_<0> to BLK_<2>. In this case, the decoder 11 outputs the access address signal BLK_<0:3>=(L, L, L, H) to the block selection circuit 13.

Address allocation information is stored in the address allocation information storage unit 12 illustrated in FIG. 2. Here, the address allocation information is address information which is allocated to each of the memory blocks BLK_0 to BLK_4 (15_0 to 15_4). In other words, it is the information that the input addresses which are input into the semiconductor memory device 1 are made to correspond to the memory blocks BLK_0 to BLK_4 which are access destinations.

Figures 4, 5:
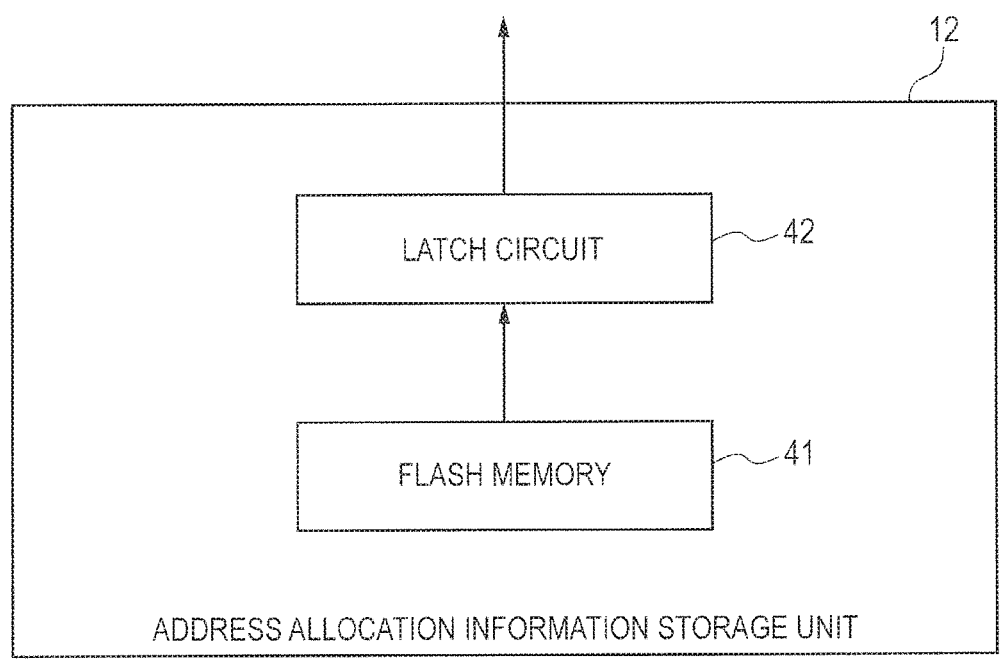
FIG. 4 is a table illustrating one example of address allocation information which is stored in an address allocation information storage unit.
FIG. 5 is a block diagram illustrating one configuration example of the address allocation information storage unit that the semiconductor memory device according to the embodiment includes.

FIG. 4 is a table illustrating one example of the address allocation information which is stored in the address allocation information storage unit 12. As illustrated in FIG. 4, one of the memory blocks BLK_0 to BLK_4 is allocated to each piece of address allocation information BLK0F to BLK3F. Specifically, the memory block BLK_0 is allocated to the address allocation information BLK0F (indicated by "H" (the high-level) in FIG. 4). In addition, the memory block BLK_1 is allocated to the address allocation information BLK0F, the memory block BLK_2 is allocated to the address allocation information BLK2F and the memory block BLK_3 is allocated to the address allocation information BLK3F respectively.

Incidentally, the memory block BLK_4 is not allocated to any piece of the address allocation information BLK0F to BLK3F. This means that it is impossible to access the memory block BLK_4 from the outside by using the input addresses. That is, the memory block BLK_4 is allotted to a memory block into which no data is stored at the ordinary time. In the present invention, this memory block is called a surplus memory block.

FIG. 5 is a block diagram illustrating one configuration example of the address allocation information storage unit 12. As illustrated in FIG. 5, for example, it is possible to configure the address allocation information storage unit 12 by using a flash memory 41 and a latch circuit 42. Such pieces of the address allocation information BLK0F to BLK3F as illustrated in FIG. 4 are stored in the flash memory 41. In addition, the latch circuit 42 reads pieces of the address allocation information BLK0F to BLK3F out of the flash memory 41 and laches them.

When pieces of the address allocation information BLK0F to BLK3F are to be read out of the address allocation information storage unit 12, the block selection circuit 13 (see FIG. 2) reads pieces of the address allocation information BLK0F to BLK3F which are latched in the latch circuit 42 (see FIG. 5). Here, reading of pieces of the address allocation information BLK0F to BLK3F out of the latch circuit 42 is faster than reading out of the flash memory 41. Accordingly, the block selection circuit 13 is able to read pieces of the address allocation information BLK0F to BLK3F out of the latch circuit 42 at a high speed.

For example, when the semiconductor memory device 1 is powered on, the latch circuit 42 reads pieces of the address allocation information BLK0F to BLK3F out of the flash memory and latches them. In addition, also after the address allocation information which is stored in the flash memory 41 is rewritten by a refreshing operation which will be described later, the latch circuit 42 reads pieces of the address allocation information BLK0F to BLK3F so rewritten out of the flash memory 41 and latches them.

Incidentally, when pieces of the address allocation information BLK0F to BLK3F are to be rewritten, new pieces of the address allocation information BLK0F to BLK3F may be directly written into the flash memory 41. In this case, after the address allocation information stored in the flash memory 41 is rewritten, the latch circuit 12 reads pieces of the address allocation information BLK0F to BLK3F so rewritten out of the flash memory 41 and latches them.

In addition, an operation of rewriting the information in the latch circuit 12 by using new pieces of the address allocation information BLK0F to BLK3F and an operation of writing the new pieces of the address allocation information BLK0F to BLK3F into the flash memory 41 may be simultaneously performed in parallel with each other. In this case, it is possible to rewrite the information in the latch circuit 42 at a high speed.

The block selection circuit 13 illustrated in FIG. 2 selects one memory block which corresponds the input addresses which are input on the basis of the address allocation information. That is, the block selection circuit 13 selects the memory block which is the access destination on the basis of the access address signal BLK_<0:3> which is supplied from the decoder 11 and pieces of the address allocation information BLK0F to BLK3F which are supplied from the address allocation information storage unit 12.

Figure 6:
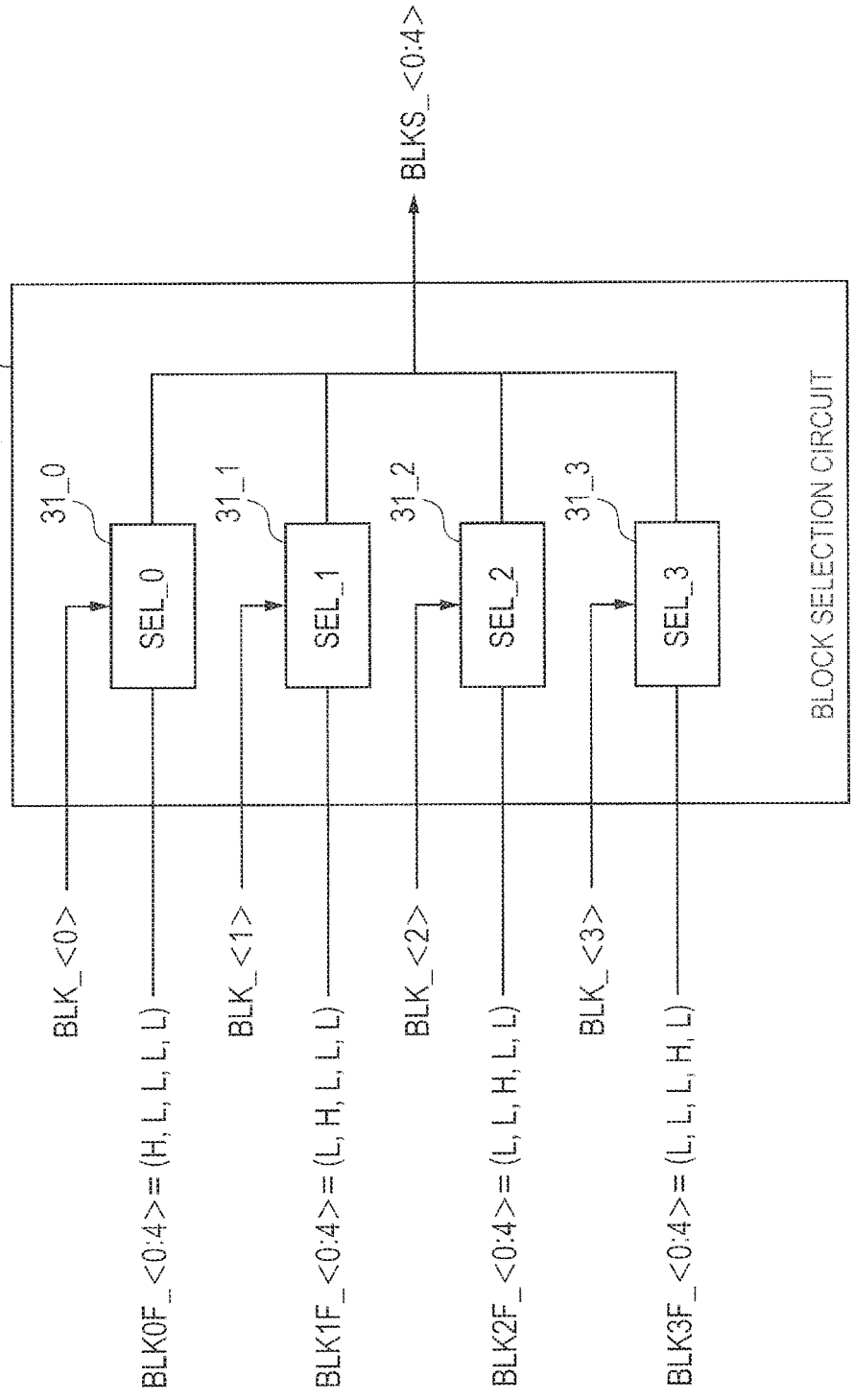
FIG. 6 is a block diagram illustrating one configuration example of a block selection circuit that the semiconductor memory device according to the embodiment includes.

FIG. 6 is a block diagram illustrating one configuration example of the block selection circuit 13. As illustrated in FIG. 6, the block selection circuit 13 includes selectors SEL_0 to SEL_3 (31_0 to 31_3). Each piece of the address allocation information BLK0F to BLK3F is supplied to an input of each of the selectors SEL_0 to SEL_3. The address allocation information BLK0F to BLK3F which is supplied to each of the selectors SEL_0 to SEL_3 correspond to the address allocation information BLK0F to BLK3F indicated in the table in FIG. 4. In addition, each of the access address signals BLK_<0> to BLK_<3> is supplied to each of the selectors SEL_0 to SEL_3.

The respective selectors SEL_0 to SEL_3 are configured to output pieces of the address allocation information BLK0F to BLK3F when the high-level access address signals BLK_<0> to BLK_<3> are supplied. Pieces of the address allocation information BLK0F to BLK3F which are output are supplied to the respective memory blocks BLK_0 to BLK_4 as pieces of selection address information BLKS_<0> to BLKS_<4>.

In the present embodiment, the configuration is made in such a manner that one of the access address signals BLK_<0> to BLK_<3> becomes the high level. Therefore, when the high-level access address signals BLK_<0> to BLK_<3> are supplied to the block selection circuit 13, one piece of the address allocation information BLK0F to BLK3F is output from the block selection circuit 13. Here, they are allocated to respective pieces of the address allocation information BLK0F to BLK3F respectively in such a manner that one of the memory blocks BLK_0 to BLK_4 becomes the high level. Accordingly, one of the memory blocks BLK_0 to BLK_4 is selected.

Next, operations performed until one of the memory blocks BLK_0 to BLK_4 is selected after the input addresses (Add_0, Add_1) are into the semiconductor memory device 1 will be described by using a timing chart illustrated in FIG. 7.

Figure 7:
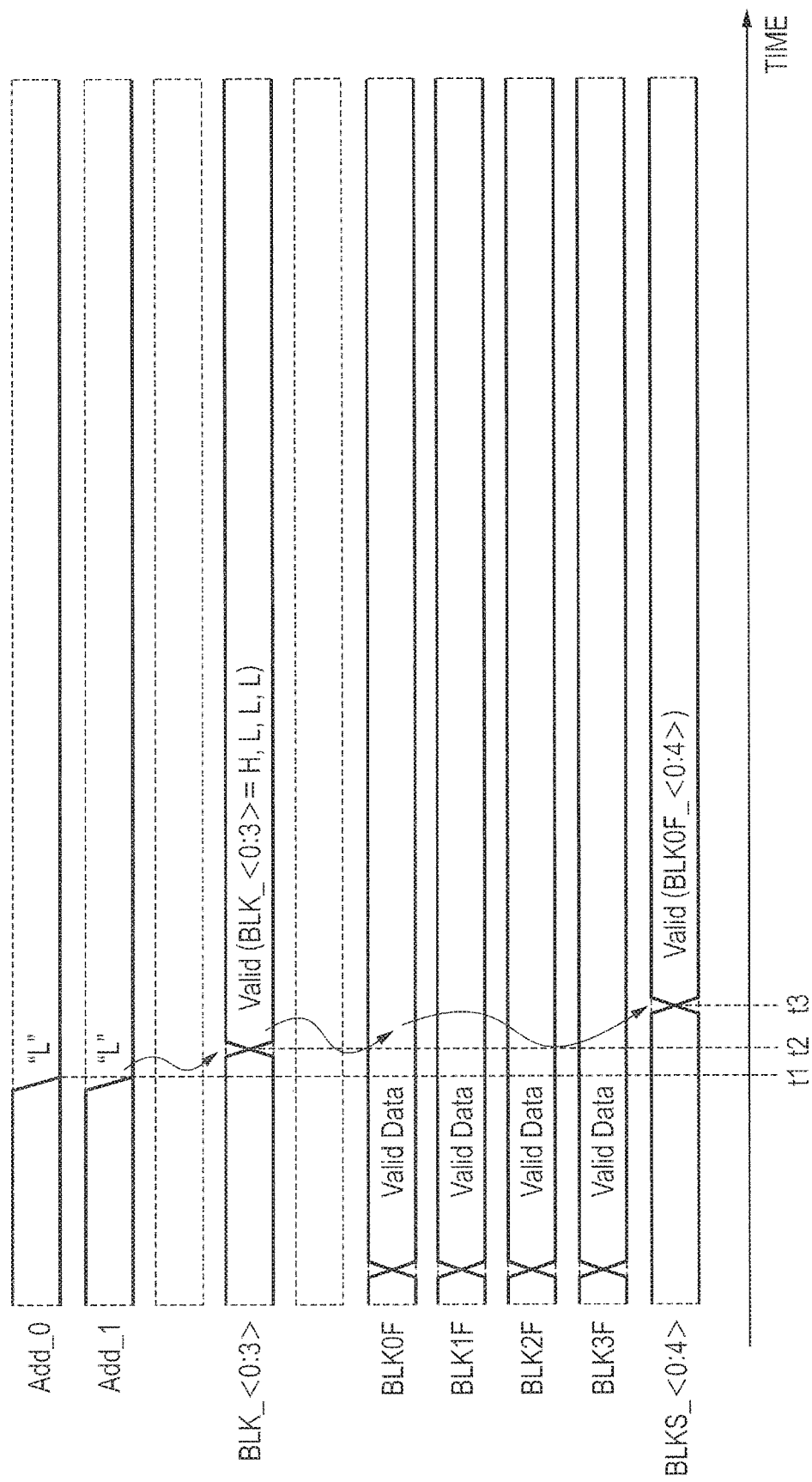
FIG. 7 is a timing chart illustrating one example of an operation of the semiconductor memory device according to the embodiment.

When the input addresses (Add_0="L", Add_1="L") are input into the semiconductor memory device 1 at a timing t1 in FIG. 7, the decoder 11 decodes the input addresses (Add_0, Add_1). More specifically, the decoder 11 decodes the input addresses (Add_0, Add_1) and generates the access address signal BLK_<0:3> used to access the memory block which corresponds to the input addresses (Add_0, Add_1). The generated access address signal BLK_<0:3> is output to the block selection circuit 13 (a timing t2).

Since the input addresses Add_0, Add_1 are both at the low levels in the case illustrated in FIG. 7, the decoder 11 supplies the access address signal BLK_<0:3>=(H, L. L. L) to the block selection circuit 13.

When the access address signal BLK_<0:3>=(H, L, L, L) is supplied from the decoder 11, a high-level signal is supplied to the selector SEL_0 (see FIG. 6) of the block selection circuit 13 as the access address signal BLK_<0>. In addition, low-level signals are supplied to the selectors SEL_1 to SEL_3 as the access address signals BLK_<1> to BLK_<3> respectively. In this case, since the high-level access address signal BLK_<0> is supplied to the selector SEL_0, the selector SEL_0 outputs the address allocation information BLK0F as selection address information BLKS_<0:4> (a timing t3).

As illustrated in FIG. 4, the memory block BLK_0 is allocated to the address allocation information BLK0F. Thus, the selection address information BLKS_<0:4> becomes BLKS_<0:4>=(H, L, L, L, L). Accordingly, in this case, since the selection address information BLKS_<0> which is output from the block selection circuit 13 becomes the high level and other pieces of the selection address information BLKS_<1> to BLKS_<4> become the low levels, the memory block BLK_0 is selected.

In the semiconductor memory device 1 according to the present embodiment, it is possible to change the memory block to be selected by changing the memory blocks BLK_0 to BLK_4 to be allocated to pieces of the address allocation information BLK0F to BLK3F.

For example, in a case where the memory block BLK_1 is allocated to the address allocation information BLK0F, the selection address information BLKS_<0:4> becomes BLKS_<0:4>=(L, H, L, L, L). In this case, the selection address information BLKS_<1> which is output from the block selection circuit 13 becomes the high level and other pieces of the selection address information BLKS_<0>, BLKS_<2> to BLKS_<4> become the low levels. Accordingly, the memory block BLK_1 is selected.

Figure 8:
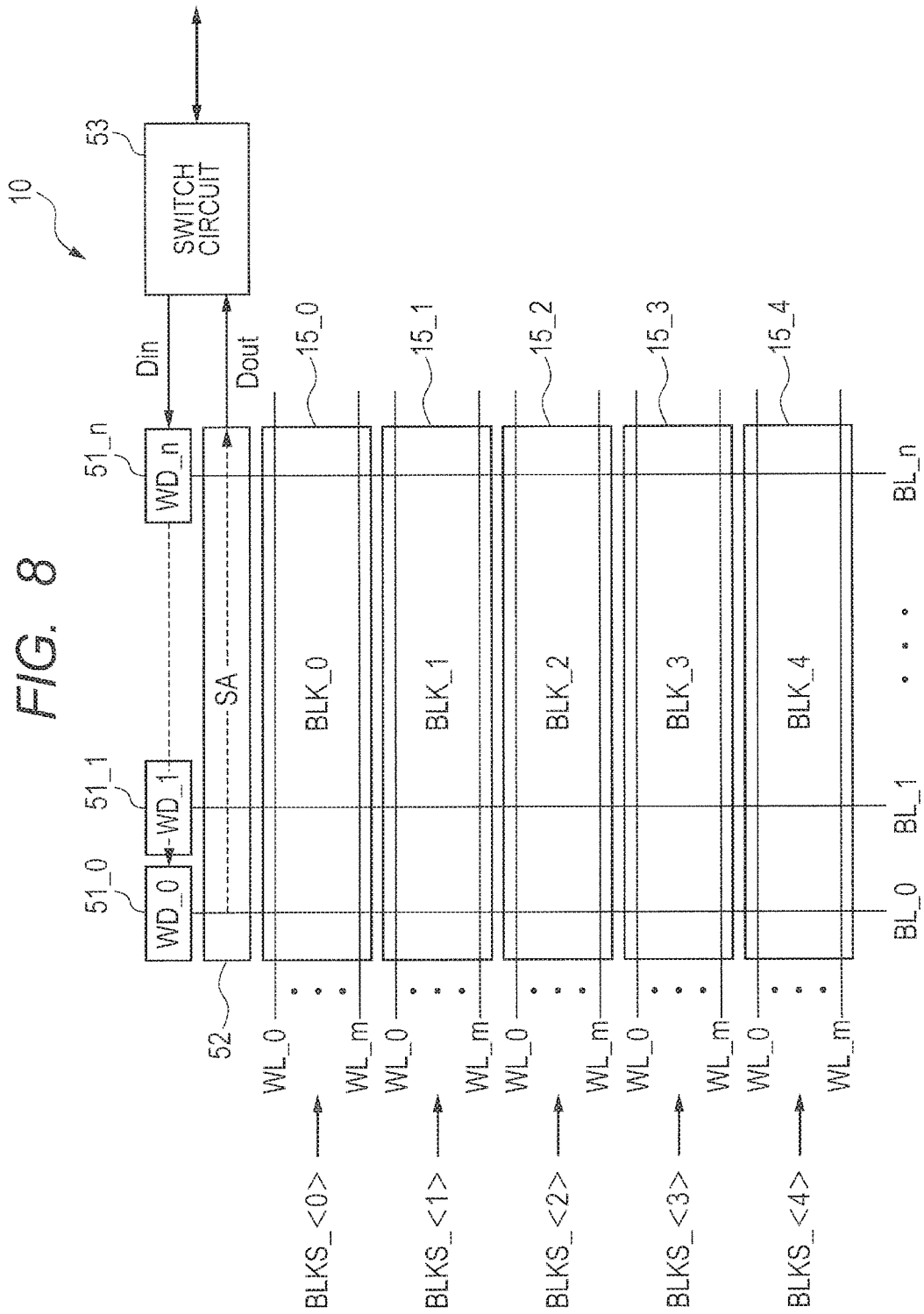
FIG. 8 is a block diagram illustrating one example of a detained configuration of a memory array that the semiconductor memory device according to the embodiment includes.

Next, a detailed configuration of the memory array 10 will be described by using FIG. 8. As illustrated in FIG. 8, m+1 word lines WL_0 to WL_m (m is a positive integer including 0) are provided for each of the memory blocks BLK_0 to BLK_4. Each of the word lines WL_0 to WL_m is coupled to the memory cell (not illustrated) that each of the memory blocks BLK_0 to BLK_4 includes. Each of the word lines WL_0 to WL_m is coupled to a word line driver (not illustrated). The word line driver (not illustrated) brings the word line to an active state (for example, the high level) when data is to be written into the memory cell and when the data is to be read out of the memory cell.

In addition, n+1 bit lines BL_0 to BL_n are provided for each of the memory blocks BLK_0 to BLK_4 (n is a positive integer including 0). Each of the bit lines BL_0 to BL_n is coupled to the memory cell (not illustrated) that each of the memory blocks BLK_0 to BLK_4 includes. In addition, each of the bit lines BL_0 to BL_n is provided over each of the memory blocks BLK_0 to BLK_4.

Each of the bit lines BL_0 to BL_n is coupled to each of write data latch circuits WD_0 to WD_n (51_0 to 51_*n*). Each of the write data latch circuits WD_0 to WD_n is a circuit adapted to temporarily latch data to be written into each of the memory blocks BLK_0 to BLK_4. In addition, each of the bit lines BL_0 to BL_n is coupled to a sense amplifier SA (52). The sense amplifier SA (52) amplifies signals on the bit lines BL_0 to BL_n when data is to be read out of the memory cell of each of the memory blocks BLK_0 to BLK_4.

A switch circuit 53 switches data input into the memory array 10 from the outside and data output from the memory array 10 to the outside.

For example, in a case where data is to be written into the memory blocks BLK_0 o BLK_4, the switch circuit 53 supplies write data which is supplied from the outside to the write data latch circuits WD_0 to WD_n via a data input line Din. The write data latch circuits WD_0 to WD_n temporarily latch the supplied write data. Thereafter, when a write pulse is supplied, the data which is latched in the write data latch circuits WD_0 to WD_n is supplied to the memory cells of a predetermined memory block via the bit lines BL_0 to BL_n. In addition, the word lines WL_0 to WD_m which correspond to the memory cells into which the data is to be written become the active states and the data is written into the memory cells of the predetermined memory block.

In a case where the data is to be read out of the memory blocks BLK_0 to BLK_4, the word lines WL_0 to WL_m which correspond to the memory cells out of which the data is to be read and the signals on the bit lines BL_0 to BL_n are amplified by using the sense amplifier 52. The data which is read out by using the sense amplifier 52 is supplied to the switch circuit 53 via a data output line Dout. Then, the switch circuit 53 outputs the read-out data to the outside of the memory array 10.

Next, a refreshing operation of the semiconductor memory device 1 according to the present embodiment will be described. The refreshing operation is performed by using the refresh control circuit 17 illustrated in FIG. 2. Specifically, when a refresh command is supplied, the refresh control circuit 17 performs the refreshing operation on a predetermined memory block of the memory array 10.

In the semiconductor memory device 1 according to the present embodiment, one of the plurality of memory blocks BLK_0 to BLK_4 is allotted to the surplus memory block into which no data is stored at the ordinary time. For example, in a case where the memory block BLK_4 is allotted to the surplus memory block, at the ordinary time, although data is stored into the memory blocks BLK_0 to BLK_3, no data is stored into the memory block BLK_4. In the semiconductor memory device 1 according to the present embodiment, the refreshing operation is performed by transferring data from one memory block which is a refreshing object to the surplus memory block.

In the following, the refreshing operation of the semiconductor memory device 1 according to the present embodiment will be described by using a flowchart illustrated in FIG. 9 Incidentally, although in the following, a case where the memory block BLK_0 is set as the memory block which is the refreshing object and the memory block BLK_4 is set as the surplus memory block will be described by way of example, a combination of the memory block which is the refreshing object and the surplus memory block is not limited to this.

Figure 9:
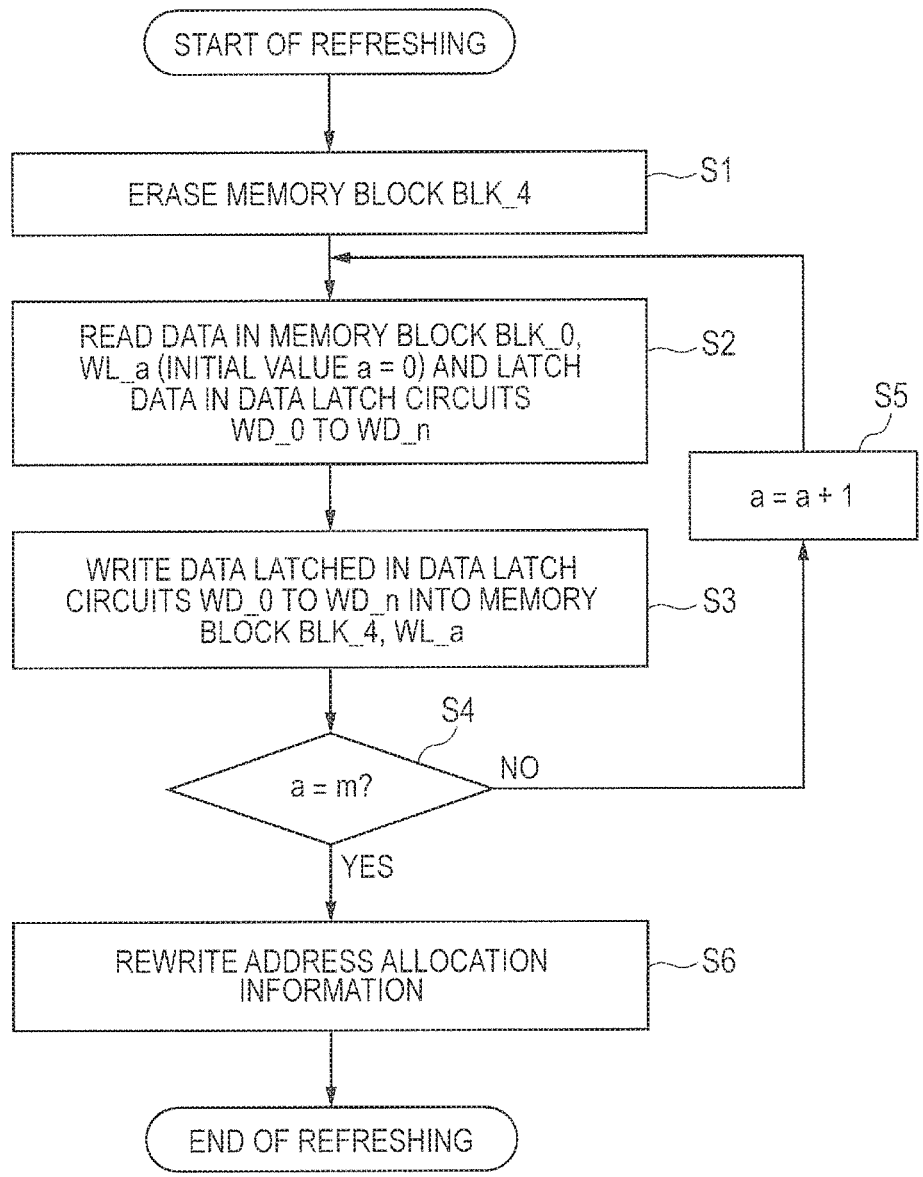
FIG. 9 is a flowchart illustrating one example of the operation of the semiconductor memory device according to the embodiment.

As illustrated in FIG. 9, first, the refresh control circuit 17 performs a block-erasing on the data in the memory block BLK_4 (step S1). That is, the refresh control circuit 17 performs the block-erasing on the data in the memory block BLK_4 before transferring data to the memory block BLK_4 which is the surplus memory block.

Next, the refresh control circuit 17 transfers the data stored in the memory block BLK_0 which is the refreshing object in the plurality of memory blocks BLK_0 to BLK_4 to the surplus memory block BLK_4.

At this time, the refresh control circuit 17 temporarily latches the data which is read out of the memory block BLK_0 which is the refreshing object in the write data latch circuits WD_0 to WD_n (see FIG. 8) and thereafter writes the latched data into the surplus memory block BLK_4. Data transfer from the memory block BLK_0 which is the refreshing object to the surplus memory block BLK_4 is performed in units of the word lines WL_0 to WL_m. This is because a writing unit of an ordinary operation is the word line unit and a refreshing unit is one block (that is, in units of WL_0 to WL_m) and therefore a case where data transfer is performed in such units is illustrated by way of example.

Specifically, the word line WL_0 of the memory block BLK_0 illustrated in FIG. 8 is brought into the active state and n+1 pieces of data which correspond to the word lines WL_0 of the memory block BLK_0 are read out via the n+1 bit lines BL_0 to BL_n. At this time, the sense amplifier 52 reads out pieces of the data by amplifying the signals on the bit lines BL_0 to BL_n. Pieces of the data which are read out by using the sense amplifier 52 are supplied to the switch circuit 53 via the data output line Dout. The switch circuit 53 supplies pieces of the read-out data to the write data latch circuits WD_0 to WD_n via the data input line Din. Pieces of the data which are read out of the memory block BLK_0 are latched in the write data latch circuits WD_0 to WD_n (step S2 in FIG. 9).

Thereafter, the word line WL_0 of the surplus memory block BLK_4 illustrated in FIG. 8 is brought into the active state and the n+1 pieces of data which are latched in the write data latch circuits WD_0 to WD_n are written into the surplus memory block BLK_4 via the n+1 bit lines BL_0 to BL_n by this kind of operation (step S3 in FIG. 9).

It is possible to transfer pieces of the data in the memory cells which correspond to the word line WL_0 of the memory block BLK_0 to the memory cells which correspond to the word line WL_0 of the surplus memory block BLK_4 by this kind of operation.

Here, since an initial value of the word line WL_a is a=0, in a case where the number of the word lines is larger than 1, a=m (m corresponds to "the number of the word lines—1") is not satisfied (step S4 in FIG. 9: No). In this case, the value of a is incremented by 1 (that is, a=1) in step S5 and operations in step S2 and step S3 are performed again. That is, a of the word line WL_a is a=0 to m and the operations in step S2 and step S3 are performed every word lines WL_0 to WL_m.

After that, the operations in step S2 to step S5 are repeated until the condition of "a=m" is satisfied in step S4. Then, when the operations in step S2 and step S3 are performed on all the word lines WL_0 to WL_m, data transfer from the memory block BLK_0 to the surplus memory block BLK_4 is completed.

When the condition of "a=m" is satisfied in step S4 (step S4: Yes), the refresh control circuit 17 rewrites the address allocation information (see FIG. 4) stored in the address allocation information storage unit 12 (step S6). Specifically, the address information of the memory block which was the refreshing object is allocated to the surplus memory block BLK_4 to which the data is transferred and the memory block BLK_0 which was the refreshing object is newly allotted to the surplus memory block.

FIG. 10 is a table illustrating one example of the address allocation information obtained after rewritten. In the address allocation information illustrated in FIG. 10, the address allocation information BLK0F is rewritten when compared with the address allocation information illustrated in FIG. 4. That is, the memory block to be allocated to the address allocation information BLK0F is changed from the memory block BLK_0 to the memory block BLK_4. Thereby, the memory block which is selected in a case where the input addresses (the external addresses) Add_0, Add_1 which are input are both at the low levels is changed from the memory block BLK_0 to the memory block BLK_4.

That is, in a case where the input addresses (the external addresses) Add_0, Add_1 are both at the low levels, the access address signal BLK_<0> is at the high level and therefore the block selection circuit 13 illustrated in FIG. 6 outputs the address allocation information BLK0F as the selection address information BLKS_<0:4>. Here, since the address allocation information BLK0F is rewritten as illustrated in FIG. 10, the memory block to be selected is changed from the memory block BLK_0 to the memory block BLK_4. That is, it is possible to access the memory block BLK_4 so changed by using the same input addresses (the external addresses).

In addition, as illustrated in FIG. 10, the memory block BLK_0 which was the refreshing object is allocated to none of the pieces of the address allocation information BLK0F to BLK3F. This means that it is impossible to access the memory block BLK_0 from the outside by using the input addresses. That is, the memory block BLK_0 is allotted to the surplus memory block.

In the semiconductor memory device 1 according to the present embodiment, the refreshing operation is performed by providing the surplus memory block in the memory array 10 and transferring the data from the memory block which is the refreshing object to the surplus memory block in this way. The surplus memory block is changed every time the refreshing operation is performed. For example, the surplus memory block may be changed in order of the memory blocks BLK_4, BLK_0, BLK_1, BLK_2, BLK_3 at each time of the refreshing operation or may be randomly changed at each time of the refreshing operation. That is, there is no limitation on the order of the blocks to be refreshed.

In addition, a case where the refresh control circuit 17 performs the block-erasing on the data in the memory block BLK_4 (step S1) immediately after start of the refreshing operation (step S1) is illustrated in the flowchart illustrated in FIG. 9. However, in the present embodiment, the refresh control circuit 17 may be also configured to perform the block-erasing the data in the memory block which is the refreshing object after the data in the memory block which is the refreshing object is transferred to the surplus memory block.

That is, it is possible to omit the block-erasing operation (step S1) performed on the surplus block at the time of the next refreshing operation by performing the block-erasing on the data in the memory block which is newly allotted to the surplus memory block in step S6 in FIG. 9.

As described above, in the semiconductor memory device according to the present embodiment, one of the plurality of memory blocks is allotted to the surplus memory block and the data stored in the memory block which is the refreshing object is transferred to the surplus memory block at the time of the refreshing operation. Then, after completion of data transfer to the surplus memory block, the address information of the memory block which was the refreshing object is allocated to the surplus memory block to which the data is transferred thereby to make it possible to access the surplus memory block data transfer to which is completed by using the external addresses. In other words, the surplus memory block is changed to the ordinary memory block. In addition, the memory block which was the refreshing object is newly allotted to the surplus memory block.

In the semiconductor memory device according to the present embodiment, since the refreshing operation is performed by using the surplus memory block in this way, it is not necessary to temporarily save the data in the RAM which is provided outside the semiconductor memory device as in related art. In other words, in the present embodiment, it is possible to complete the refreshing operation in the semiconductor memory device. Therefore, it is possible to suppress complication of the refreshing operation. Accordingly, it is possible to simplify the refreshing operation of the semiconductor memory device.

In addition, since in related art, it is necessary to provide the RAM outside the semiconductor memory device and it is also necessary to provide a control circuit and so forth used for data transfer to the RAM, there was such an issue that the device configuration is complicated. On the other hand, in the semiconductor memory device according to the present embodiment, it is possible to realize the refreshing operation by providing one surplus memory block in the semiconductor memory device and therefore it is possible to suppress complication of the device configuration.

In addition, in the semiconductor memory device according to the present embodiment, when the data is to be transferred from one memory block to the surplus memory block, the data is temporarily latched in the write data latch circuits WD_0 o WD_n (51_0 to 51_$n$) which are provided near the memory blocks BLK_0 to BLK_4 and the data is transferred from the memory block to the surplus memory block in units of the word lines. Accordingly, it is possible to simplify a circuit used for data transfer from the memory block to the surplus memory block. That is, the data latch circuit is a circuit which is necessary for the ordinary writing operation and therefore does not lead to an increase in the number of circuits.

Although the invention made by the present inventors is specifically described on the basis of the embodiment as above, it goes without saying that the present invention is not limited to the above-described embodiment and may be modified and altered in a variety of ways within the range not deviating from the gist of the present invention.

What is claimed is:

1. A semiconductor memory device comprising:
   a memory array which includes a plurality of memory blocks;
   an address allocation information storage unit which includes:
     a flash memory which stores address allocation information which is address information allocated to the memory blocks; and
     a latch circuit which, in response to the address allocation information stored in the flash memory being rewritten, 1) reads the address allocation information obtained after rewritten out of the flash memory and 2) latches the read-out address allocation information;
   a block selection circuit which selects one memory block, wherein the selected one memory block corresponds to an input address, wherein the input address is input on a basis of the address allocation information, and wherein the block selection circuit reads the address allocation information which is latched in the latch circuit; and
   a refresh control circuit which controls a refreshing operation of the memory array,
   wherein one of the memory blocks is allotted to a surplus memory block,
   wherein when a refresh command is supplied, the refresh control circuit:
     transfers data which is stored in one memory block, wherein the one memory block is a refreshing object in the memory blocks to the surplus memory block; and
     after completion of data transfer to the surplus memory block, 1) allocates the address information of the one memory block to the surplus memory block to which the data is transferred and 2) newly allots the one memory block to the surplus memory block.

2. The semiconductor memory device according to claim 1, wherein the refresh control circuit performs a block-erasing operation on data in the surplus memory block before transferring the data to the surplus memory block.

3. The semiconductor memory device according to claim 1, wherein the refresh control circuit 1) transfers the data in the one memory block to the surplus memory block, and 2) thereafter, performs a block-erasing operation on the data in the one memory block.

4. The semiconductor memory device according to claim 1, further comprising:
   a write data latch circuit which temporarily latches data to be written into the memory blocks,
   wherein the refresh control circuit 1) temporarily latches the data which is read out of the one memory block in the write data latch circuit and 2) thereafter writes the latched data into the surplus memory block.

5. The semiconductor memory device according to claim 4, wherein the write data latch circuit is coupled to bit lines which are provided across the memory blocks.

6. The semiconductor memory device according to claim 5, wherein data transfer from the one memory block to the surplus memory block is performed in units of word lines.

7. The semiconductor memory device according to claim 6, wherein the refresh control circuit:
   brings word lines WL_a of the one memory block into an active state;
   reads n+1 pieces of data, which correspond to the word lines WL_a of the one memory block, via n+1 bit lines, wherein n is a positive integer including 0; and
   lathes the n+1 pieces of data in the write data latch circuit;
   after bringing the word lines WL_a of the one memory block into the active state, reading n+1 pieces of data via n+1 bit lines, and latching the n+1 pieces of data in the write data latch circuit:
brings the word lines WL_a of the surplus memory block into the active state; and
performs an operation of writing the n+1 pieces of data latched in the write data latch circuit into the surplus memory block via the n+1 bit lines for every word lines WL_a, wherein a=0 through m, wherein a and m are positive integers including 0.

8. The semiconductor memory device according to claim 1, wherein when the semiconductor memory device is powered on, the latch circuit reads the address allocation information out of the flash memory and latches the read-out address allocation information.

9. A refreshing method of a semiconductor memory device, wherein the semiconductor memory device comprises:
a memory array which includes a plurality of memory blocks;
an address allocation information storage unit includes:
a flash memory which stores address allocation information which is address information allocated to the memory blocks; and
a latch circuit which, in response to the address allocation information stored in the flash memory being rewritten, 1) reads the address allocation information obtained after rewritten out of the flash memory and 2) latches the read-out address allocation information; and
a block selection circuit which selects one memory block, wherein the selected one memory block corresponds to an input address, wherein the input address is input on a basis of the address allocation information, wherein the block selection circuit reads the address allocation information which is latched in the latch circuit, the refreshing method comprising:
allotting one of the memory blocks to a surplus memory block,
when a refresh command is supplied:
transferring data stored in one memory block, wherein the one memory block is a refreshing object in the memory blocks to the surplus memory block, and
after completion of data transfer to the surplus memory block, 1) allocating the address information of the one memory block to the surplus memory block to which the data is transferred and 2) newly allotting the one memory block to the surplus memory block.

* * * * *